United States Patent
Wu et al.

(10) Patent No.: US 12,324,212 B2
(45) Date of Patent: Jun. 3, 2025

(54) SEMICONDUCTOR STRUCTURE WITH INTERCONNECTS AND METHOD FOR PREPARING SAME

(71) Applicant: CHANGXIN MEMORY TECHNOLOGIES, INC., Hefei (CN)

(72) Inventors: Tieh-Chiang Wu, Hefei (CN); Lingxin Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 563 days.

(21) Appl. No.: 17/708,281

(22) Filed: Mar. 30, 2022

(65) Prior Publication Data
US 2023/0055307 A1  Feb. 23, 2023

Related U.S. Application Data

(63) Continuation of application No. PCT/CN2022/072283, filed on Jan. 17, 2022.

(30) Foreign Application Priority Data

Aug. 20, 2021  (CN) .................. 202110963300.X

(51) Int. Cl.
*H10D 64/23* (2025.01)
*H01L 21/3213* (2006.01)
(Continued)

(52) U.S. Cl.
CPC ....... *H10D 64/258* (2025.01); *H01L 21/3213* (2013.01); *H01L 21/7685* (2013.01);
(Continued)

(58) Field of Classification Search
CPC . H10B 12/0335; H10B 12/482; H10B 12/485
See application file for complete search history.

(56) References Cited

U.S. PATENT DOCUMENTS

| 6,235,620 B1 | 5/2001 | Saito |
| 6,528,368 B1 | 3/2003 | Park |
| (Continued) | | |

FOREIGN PATENT DOCUMENTS

| CN | 1246727 A | 3/2000 |
| CN | 102024784 A | 4/2011 |
| (Continued) | | |

OTHER PUBLICATIONS

Supplementary European Search Report in the European application No. 22715962.1, mailed on Dec. 22, 2022, 7 pgs.

*Primary Examiner* — John P. Dulka
(74) *Attorney, Agent, or Firm* — Kilpatrick Townsend & Stockton LLP

(57) ABSTRACT

Provided are a semiconductor structure and method for preparing same. The semiconductor structure includes a gate, a source or a drain being provided in the substrate at either side of the gate; a dielectric layer; a contact structure; a first electrical connection part and a second electrical connection part arranged at intervals. The second electrical connection part is in contact with a partial top surface of the contact structure. The first electrical connection part includes a first barrier layer and a first conductive layer which are stacked. In a direction from the source to the drain, a distance between the sidewall of the first barrier layer facing the contact structure and the contact structure is a first distance, and a distance between the sidewall of the first conductive layer facing the contact structure and the contact structure is a second distance, the first distance being greater than the second distance.

13 Claims, 4 Drawing Sheets

(51) Int. Cl.
*H01L 21/768* (2006.01)
*H01L 23/528* (2006.01)
*H01L 23/532* (2006.01)
*H10D 64/01* (2025.01)

(52) U.S. Cl.
CPC .... *H01L 23/5283* (2013.01); *H01L 23/53266* (2013.01); *H10D 64/01* (2025.01)

(56) References Cited

U.S. PATENT DOCUMENTS

| | | |
|---|---|---|
| 7,172,971 B2 | 2/2007 | Jeon |
| 7,268,072 B2 | 9/2007 | Deboer |
| 2003/0162353 A1 | 8/2003 | Park |
| 2005/0077560 A1 | 4/2005 | Shiratake |
| 2006/0063378 A1 | 3/2006 | Lin |
| 2007/0111432 A1 | 5/2007 | Oh |
| 2008/0045007 A1 | 2/2008 | In |
| 2008/0121943 A1 | 5/2008 | Lin |
| 2010/0187654 A1 | 7/2010 | Oh |
| 2011/0068411 A1 | 3/2011 | Sun |
| 2011/0272765 A1* | 11/2011 | Seo .................. H01L 29/66545 257/E21.409 |
| 2018/0019244 A1* | 1/2018 | Kim .................... H10D 62/115 |
| 2018/0248013 A1 | 8/2018 | Chowdhury et al. |

FOREIGN PATENT DOCUMENTS

| | | |
|---|---|---|
| CN | 108811517 A | 11/2018 |
| JP | 2010267987 A | 11/2010 |

* cited by examiner

SEMICONDUCTOR STRUCTURE WITH INTERCONNECTS AND METHOD FOR PREPARING SAME

CROSS-REFERENCE TO RELATED APPLICATIONS

The present application is a U.S. continuation application of International Application No. PCT/CN2022/072283, filed on Jan. 17, 2022, which claims priority to Chinese Patent Application No. 202110963300.X, filed on Aug. 20, 2021. International Application No. PCT/CN2022/072283 and Chinese Patent Application No. 202110963300.X are incorporated herein by reference in their entireties.

TECHNICAL FIELD

Embodiments of the disclosure relate to, but are not limited to, a semiconductor structure and a method for preparing the same.

BACKGROUND

Memory is a common semiconductor structure, inside of which there are many tiny conductive structural units, such as gate, bit line, source and drain and the like. In order to lead such tiny conductive structures out, metal interconnection structures are usually fabricated on the conductive structures.

Using metal interconnection structures to lead the conductive structures out can not only improve the operation rate of the memory, but also increase the integration level of the memory. Typically, in a semiconductor structure, a plurality of contact structures located in a dielectric layer and electrical connection parts connected with the contact structures are provided as metal interconnection structures. In addition, metal interconnection structures are arranged apart from each other, and conductive structures isolated from each other are respectively led out.

However, as the size of the memory becomes smaller and smaller, the contact structures and electrical connection parts inside the memory are arranged more and more compactly, which easily leads to the problem of short circuit inside the semiconductor structure.

SUMMARY

In one aspect, embodiments of the present disclosure provide a semiconductor structure, including: a substrate; a gate located on a part of the substrate, in which a source or a drain is provided in the substrate at either side of the gate; a dielectric layer located on the substrate, in which the dielectric layer covers a top surface and sidewalls of the gate; a contact structure penetrating through the dielectric layer and electrically connected with the source or the drain; a first electrical connection part and a second electrical connection part arranged at intervals. The first electrical connection part and the second electrical connection part are both located on a top surface of the dielectric layer, and the second electrical connection part is also in contact with of a partial top surface of the contact structure. The first electrical connection part includes a first barrier layer and a first conductive layer which are stacked. In a direction from the source to the drain, a distance between the sidewall of the first barrier layer facing the contact structure and the contact structure is a first distance, and a distance between the sidewall of the first conductive layer facing the contact structure and the contact structure is a second distance. The first distance is greater than the second distance.

In another aspect, according to some embodiments of the present disclosure, the embodiments of the present disclosure provide a method for preparing a semiconductor structure, including: providing a substrate and a gate located on a part of the substrate, in which a source or a drain is provided in the substrate at either side of the gate; a dielectric layer covering a top surface and sidewalls of the gate is also provided on the substrate; forming a contact structure penetrating through the dielectric layer and electrically connected with the source or the drain; forming a first electrical connection part and a second electrical connection part arranged at intervals. The first electrical connection part and the second electrical connection part are both located on a top surface of the dielectric layer, and the second electrical connection part are also in contact with a partial top surface of the contact structure. The first electrical connection part includes a first barrier layer and a first conductive layer which are stacked. In the direction from the source to the drain, a distance between the sidewall of the first barrier layer facing the contact structure and the contact structure is a first distance, and a distance between the sidewall of the first conductive layer facing the contact structure and the contact structure is a second distance. The first distance is greater than the second distance.

BRIEF DESCRIPTION OF THE DRAWINGS

One or more embodiments are exemplarily illustrated by the pictures corresponding thereto in the drawings. These exemplary descriptions do not constitute limitations on the embodiments, and the figures in the drawings do not constitute scale limitations unless otherwise stated.

DETAILED DESCRIPTION

It can be known from the background that the related art has the problem of easy short circuit between the electrical connection parts and the contact structures arranged at intervals.

It is found by analysis that one of the reasons for easy short circuit between the electrical connection part and the contact structure is that the distance between an electrical connection part and the contact structure adjacent thereto is small, which makes it easy to short-circuit between the bottom of the electrical connection part and the top surface of the contact structure adjacent thereto.

Figure 1:
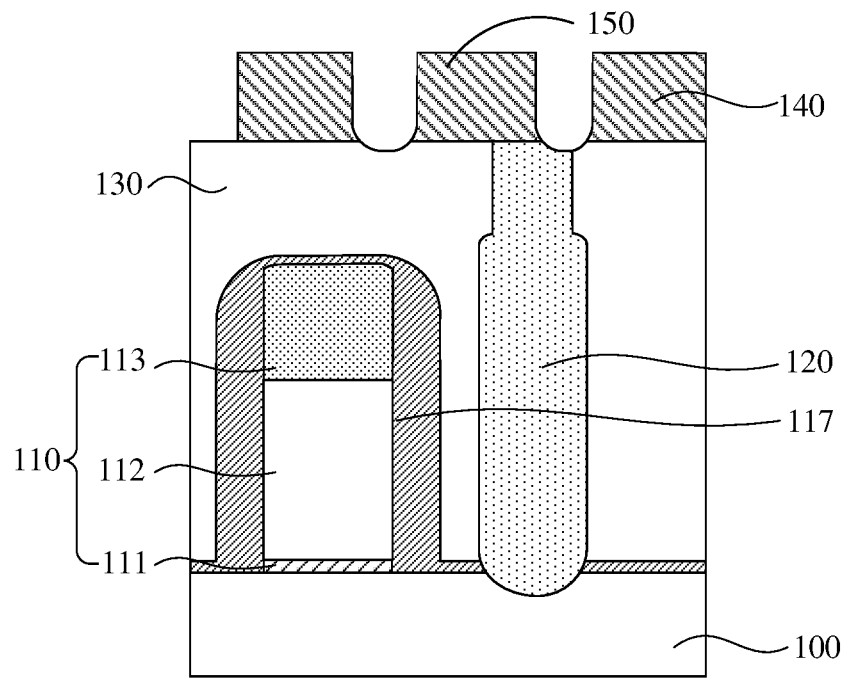
FIG. 1 is a schematic structural diagram in section of a semiconductor structure.

The causes of the above problem are now further analyzed in combination with a semiconductor structure. FIG. 1 is a schematic structural diagram of a semiconductor structure. Referring to FIG. 1, a semiconductor structure includes: a substrate 100; a gate 110 located on a part of the substrate 100 and a sidewall layer 117 located on the surface of the gate 110, in which the gate 110 includes a gate dielectric layer 111, a gate conductive layer 112 and a gate capping layer 113, and a source or a drain is provided in the substrate 100 at either side of the gate 110; a dielectric layer 130 located on the substrate 100 and covering the top surface and the sidewalls of the gate 110; a contact structure 120 penetrating through the dielectric layer 130 and electrically connected with the source or the drain; a first electrical connection part 140 and a second electrical connection part 150 which are arranged at intervals, in which the first electrical connection part 140 and the second electrical connection part 150 are both located on the top surface of the dielectric layer 130, and the second electrical connection part 150 is also in contact with a partial top surface of the contact structure 120.

The second electrical connection part 150 is in contact with a partial top surface of the contact structure 120, and the first electrical connection part 140 is in contact with a partial top surface of another contact structure (not shown), to lead isolated sources or drains out, respectively. In the process of forming the first electrical connection part 140 and the second electrical connection part 150, there may be an alignment error, which causes the distance between the contact structure 120 and the first electrical connection part 140 to be too small, so that a short circuit easily occurs between the top of the contact structure 120 and the bottom of the first electrical connection part 140.

Embodiments of the present disclosure provide a semiconductor structure, in which only the bottom contour of the first electrical connection part is changed, so that the distance between the first barrier layer and the contact structure is larger, so as to avoid the problem that the distance between the first electrical connection part and the contact structure is too close due to the alignment error in the process of forming the first electrical connection part and the second electrical connection part, thereby reducing the risk of short circuit and increasing the process window for forming the first electrical connection part and the second electrical connection part.

The embodiments of the present disclosure will be described in detail below with reference to the accompanying drawings. However, those ordinary skilled in the art should understand that in the embodiments of the present disclosure, numerous technical details are proposed for a reader to better understand the present disclosure. But even without these technical details and various variations and modifications based on the following embodiments, the technical solutions claimed in the present disclosure may be implemented.

Figure 2:
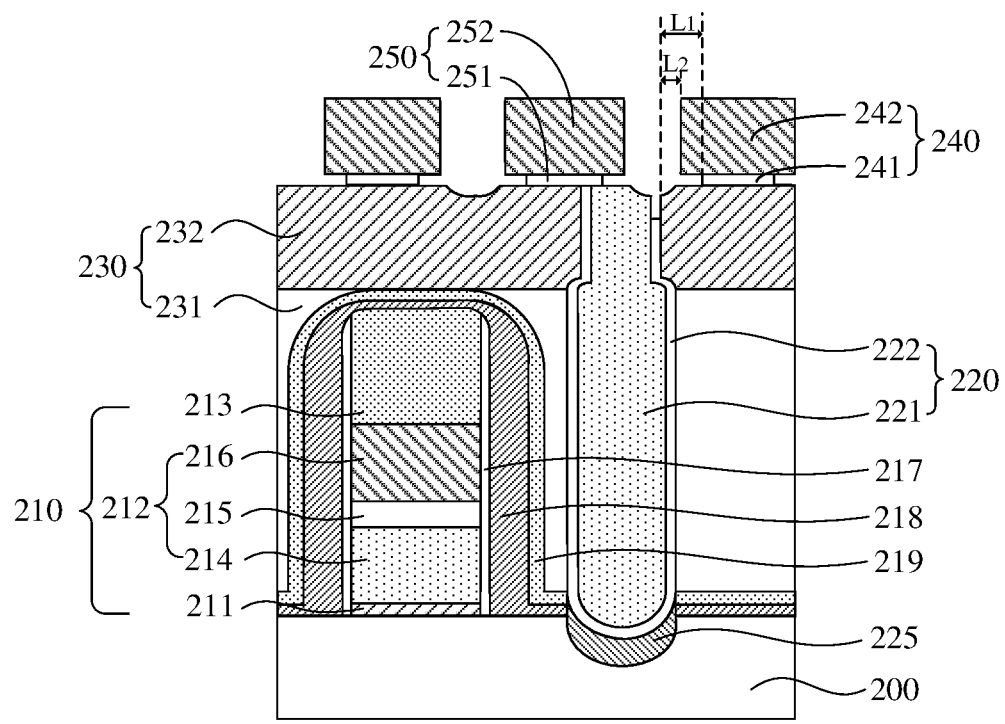
FIG. 2 is a schematic structural diagram in section of a semiconductor structure provided by an embodiment of the present disclosure.

FIG. 2 is a schematic structural diagram of a semiconductor structure provided by an embodiment of the present disclosure;

Referring to FIG. 2, the semiconductor structure includes: a substrate 200; a gate 210 located on a part of the substrate 200, in which a source or a drain is provided in the substrate 200 at either side of the gate 210; a dielectric layer 230 located on the substrate 200 and covering a top surface and sidewalls of the gate 210; a contact structure 220 penetrating through the dielectric layer 230 and electrically connected with the source or the drain; a first electrical connection part 240 and a second electrical connection part 250 which are arranged at intervals. The first electrical connection part 240 and the second electrical connection part 250 are both located on the top surface of the dielectric layer 230, and the second electrical connection part 250 are also in contact with a partial top surface of the contact structure 220. The first electrical connection part 240 includes a first barrier layer 241 and a first conductive layer 242 which are stacked. In a direction from the source to the drain, the distance between the sidewall of the first barrier layer 241 facing the contact structure 220 and the contact structure 220 is a first distance $L_1$, and the distance between the sidewall of the first conductive layer 242 facing the contact structure 220 and the contact structure 220 is a second distance $L_2$. The first distance $L_1$ is greater than the second distance $L_2$.

In the embodiment, only the bottom contour of the first electrical connection part 240 is changed so that the distance between the first barrier layer 241 and the contact structure 220 adjacent thereto is increased. Therefore, the two do not easily touch, reducing the risk of short circuit in the semiconductor structure. Also, a process window for forming the first electrical connection part 240 and the second electrical connection part 250 is increased. In addition, the width of the first conductive layer 242 is not changed, so that the first conductive layer 242 has a relatively larger volume and a smaller resistance. Therefore, a good conductivity of the first electrical connection part 240 can be maintained.

The semiconductor structure may be a memory such as DRAM (Dynamic Random Access Memory), SRAM (Static Random-Access Memory), or SDRAM (Synchronous Dynamic Random-Access Memory).

The substrate 200 may be a semiconductor substrate or a silicon-on-insulator substrate. In some embodiments, the substrate 200 may be a silicon substrate. In other embodiments, the substrate 200 may also be a germanium substrate, a silicon germanium substrate, or a silicon carbide substrate.

The gate 210 includes a gate dielectric layer 211, a gate conductive layer 212 and a gate capping layer 213 which are sequentially stacked. In some embodiments, the gate conductive layer 212 may include a first gate conductive layer 214, a barrier layer 215 and a second gate conductive layer 216 which are sequentially stacked. The barrier layer 215 can prevent mutual diffusion between the first gate conductive layer 214 and the second gate conductive layer 216, and the material of the first gate conductive layer 214 is a semiconductor material and the material of the second gate conductive layer 216 is a metal material. In some embodiments, the material of the first gate conductive layer 214 may be polysilicon, the material of the barrier layer 215 may be titanium nitride, and the material of the second gate conductive layer 216 may be any one of tungsten, copper or aluminum.

In other embodiments, the gate conductive layer may be a single-layer structure, and the material of the gate conductive layer may be a semiconductor material or metal. The semiconductor material may be polysilicon, and the metal material may be any one of tungsten, copper or aluminum.

The gate capping layer 213 mainly has the function of isolation and insulation. The material of the gate capping layer 213 may be silicon oxide or silicon nitride.

The semiconductor structure may also include: first sidewall layers 217 covering the sidewalls of the gate 210; a second sidewall layer 218 covering the sidewalls of the first sidewall layers 217, the gate 210, and a part of the substrate 200; and an etch stopping layer 219 covering the second sidewall layer 218.

A source is provided in the substrate 200 at one side of the gate 210, and a drain is provided in the substrate 200 at the other side of the gate 210. The bottom surface of the contact structure 220 is electrically connected with the source or the drain, and the top surface of the contact structure 220 is connected with the second electrical connection part 250, so that the source or the drain forms an electrical connection with the second electrical connection part 250. In some embodiments, the semiconductor structure is a PMOS transistor, and the doped ions of the source and the drain are P-type ions. In other embodiments, the semiconductor structure is an NMOS transistor, and the doped ions of the source and the drain are N-type ions.

The dielectric layer 230 includes a first dielectric layer 231 and a second dielectric layer 232 which are sequentially stacked. In some embodiments, the top of the first dielectric layer 231 may be flush with the top of the etch stopping layer 219 for isolating the gate 210 from other conductive structures. The second dielectric layer 232 is above the top of the etch stopping layer 219. The second dielectric layer 232 located on the top of the gate 210 may provide protection to the gate 210 during etching so that the gate 210 is not damaged. In other embodiments, the top of the first dielectric layer may be higher than the top of the etch stopping layer. In yet other embodiments, the top of the first dielectric layer may also be lower than the top of the etch stopping layer.

In some embodiments, the density of the second dielectric layer 232 is greater than that of the first dielectric layer 231 to enhance the protective effect of the second dielectric layer 232 on the gate 210. In other embodiments, the density of the second dielectric layer 232 may also be equal to that of the first dielectric layer 231.

In some embodiments, the material of the first dielectric layer 231 may be silicon oxide, and the material of the second dielectric layer 232 may be silicon nitride or silicon oxynitride.

The second electrical connection part 250 is in contact with the contact structure 220, and the first electrical connection part 240 is adjacent to the contact structure 220 and is in contact with another contact structure (not shown) in the semiconductor structure, to lead out current in two adjacent sources or drains in the substrate 200, respectively. The first barrier layer 241 in the first electrical connection part 240 covers the bottom surface of the first conductive layer 242 and is in contact with the surface of the dielectric layer 230, so that ions in the first conductive layer 242 can be prevented from diffusing into the dielectric layer 230.

In a direction from the source to the drain, the width of the first barrier layer 241 is smaller than the width of the first conductive layer 242. Accordingly, a hollow is formed among the bottom of the first conductive layer 242, the sidewall of the first barrier layer 241 facing the contact structure 220, and the top surface of the dielectric layer 230. Because of the existence of the hollow, the distance between the bottom of the first electrical connection part 240 and the contact structure 220 is larger, thereby reducing the probability of contact between the first electrical connection part 240 and the contact structure 220, and therefore reducing the risk of short circuit.

Specifically, in some embodiments, a ratio of the width of the first barrier layer to the width of the first conductive layer is 0.5 to 0.9. Within this ratio range, on the one hand, the width of the first barrier layer 241 is smaller than the width of the first conductive layer 242, so that the distance between the bottom of the first electrical connection part 240 and the contact structure 220 is larger. On the other hand, the contact area between the first barrier layer 241 and the first conductive layer 242 is larger, so that the contact resistance between the first barrier layer 241 and the first conductive layer 242 is small. As a result, the current conduction capability inside the first electrical connection part 240 is good, and thus the electrical conductivity of the first electrical connection part 240 is kept good.

The material of the first barrier layer 241 may be TiN or TaN, and the material of the first conductive layer 242 may be tungsten. The function of first barrier layer 241 is to prevent metal ions in the first conductive layer 242 from diffusing into the dielectric layer 230.

In other embodiments, the material of the first barrier layer 241 may also be Ta or Ti, and the material of the first conductive layer 242 may also be aluminum or copper.

The thickness of the first barrier layer 241 is smaller than the thickness of the first conductive layer 242. It will be understood that within this thickness range, the thickness of the first conductive layer 242 is relatively larger, and the conductivity of the first conductive layer 242 is relatively strong, so that the overall resistance of the first electrical connection part 240 is relatively small, which is conducive to improving the current conduction capability.

The orthographic projection of the first barrier layer 241 on the surface of the substrate 200 is within the orthographic projection of the first conductive layer 242 on the surface of the substrate 200. That is, the first barrier layer 241 is directly opposite to the first conductive layer 242, and in a direction from the source to the drain, the width of the first barrier layer 241 is smaller than the width of the first conductive layer 242. It should be noted that, unless otherwise specified, all widths mentioned below refer to widths in the direction from the source to the drain.

In some embodiments, the second electrical connection part 250 may include a second barrier layer 251 and a second conductive layer 252 which are stacked. The second barrier layer 251 is in contact with a partial top surface of the contact structure 220; and the top surface of the contact structure 220, a sidewall of the second barrier layer 251 and the bottom surface of the second conductive layer 252 define a hollow area. In other embodiments, the second electrical connection part may also be a single-layer structure including only the second conductive layer.

The second barrier layer 251 is in contact with a partial top surface of the contact structure 220, that is, a staggered connection structure is formed. The advantages of adopting this connection method are that: on the one hand, more electrical connection parts can be formed on a same area of the surface of the dielectric layer 230, so as to make full use of the space and improve the performance of the semiconductor structure; on the other hand, compared with the second barrier layer 251 covering the entire top surface of the contact structure 220, the existence of a part of the top surface of the contact structure 220 not connected with the second barrier layer 251 further increases the relative distance between the second electrical connection part 250 and the first electrical connection part 240, therefore reducing the risk of short circuit between the first electrical connection part 240 and the second electrical connection part 250.

Taking the direction from the first electrical connection part 240 to the second connection part 250 as the left, the sidewall of the second barrier layer 251 away from the contact structure 220 is retracted to the right relative to the sidewall of the second conductive layer 252 away from the contact structure 220, so that the relative distance between the second barrier layer 251 and the first barrier layer 241 increases. That is, the width of the second barrier layer 251 is smaller than the width of the second conductive layer 252. Therefore, by reducing only the width of the second barrier layer 251, without changing the width of the second conductive layer 252, a hollow is formed among the bottom of the second conductive layer 252, the sidewall of the second barrier layer 251 away from the contact structure 220 and the top surface of the contact structure 220. The existence of the hollow makes it difficult for the parts of the first electrical connection part 240 and the second electrical connection part 250 adjacent thereto that are prone to short circuit caused by narrow contacts to touch, thus further reducing the risk of short circuit. In addition, the sidewall of the second barrier layer 251 facing the contact structure 220 is retracted to the left relative to the sidewall of the second conductive layer 252 facing the contact structure 220, so that the distance between the bottom of the second electrical connection part 250 and the top of the contact structure (not shown) adjacent thereto is increased, and thus the probability of contact is reduced, thereby reducing the risk of short circuit.

Figure 3:
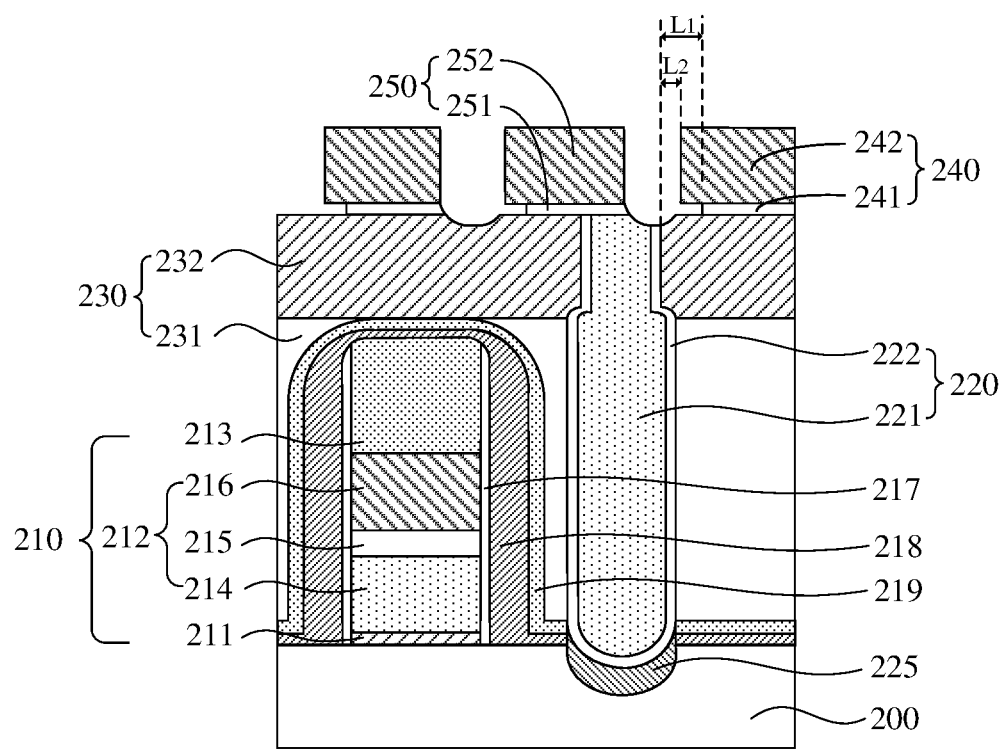
FIG. 3 is another schematic structural diagram in section of a semiconductor structure provided by an embodiment of the present disclosure.

It will be understood that in other embodiments, the sidewall of the second barrier layer facing the contact structure may also be flush with the sidewall of the second conductive layer facing the contact structure, as shown in FIG. 3.

In some embodiments, the width of the first barrier layer 241 is equal to the width of the second barrier layer in a direction from the source to the drain. This is because, in the specific process of forming the first barrier layer 241 and the second barrier layer 251, the first barrier layer 241 and the second barrier layer 251 are etched back by a one-step etching method with the same process parameters, so that the width of the first barrier layer 241 is formed to be equal to the width of the second barrier layer 251. In this way, the process can be simplified, which is conducive to large-scale production.

In other embodiments, in a direction from the source to the drain, the width of the first barrier layer 241 may also not be equal to the width of the second barrier layer 251. The sidewall of the first barrier layer 241 facing the contact structure 220 may be arranged to retract to the right relative to the sidewall of the first conductive layer 242 facing the contact structure 220, and the sidewall of the first barrier layer 241 away from the contact structure 220 may be arranged to retract to the left relative to the sidewall of the first conductive layer 242 away from the contact structure 220. The sidewall of the second barrier layer 251 facing the contact structure 220 is flush with the sidewall of the second conductive layer 252 facing the contact structure 220, and the sidewall of the second barrier layer 251 away from the contact structure 220 is retracted to the right relative to the sidewall of the second conductive layer 252 away from the contact structure 220.

In some embodiments, the material of the first barrier layer 241 may be the same as the material of the second barrier layer 251, and the material of the first conductive layer 242 may be the same as the material of the second conductive layer 252. In this way, in the actual process, in the same etching step with the same process parameters, it can be achieved simultaneously that the width of the first barrier layer 241 is smaller than the width of the first conductive layer 242, the width of the second barrier layer 251 is smaller than the width of the second conductive layer 252 at the same time, and the length of the first barrier layer 241 is equal to the width of the second barrier layer 251 in the direction from the source to the drain, simplifying the process.

The contact structure 220 penetrates through the entire dielectric layer 230. The width of the contact structure 220 located in the first dielectric layer 231 is greater than the width of the contact structure 220 located in the second dielectric layer 232, that is, a structure with narrow top and wide bottom is formed. This is because the density of the second dielectric layer 232 is relatively high, which is difficult to etch in an actual process. Therefore, the width of the contact structure 220 formed in the second dielectric layer 232 is smaller. It will be understood that in other embodiments, the width of the contact structure located in the first dielectric layer may also be equal to the width of the contact structure located in the second dielectric layer.

In some embodiments, the contact structure 220 includes a conductive body 221 penetrating through the dielectric layer 230, with the second electrical connection part 250 being in contact with a partial surface of the conductive body 221; and a diffusion barrier layer 222 located on the sidewalls and the bottom of the conductive body 221. The diffusion barrier layer 222 may block ions in the conductive body 221 from diffusing into the dielectric layer 230 and the substrate 200.

The top surface of the diffusion barrier layer 222 located between the conductive body 221 and the first electrical connection part 240 is lower than the top surface of the conductive body 221, and the conductive body 221, the dielectric layer 230 and the top surface of the diffusion barrier layer 222 located between the conductive body 221 and the first electrical connection part 240 define a through hole area. The presence of the through hole area further increases the second distance between the first barrier layer 241 and the sidewall of the contact structure 220 compared to the condition without the through hole area. In this way, the risk of short circuit between the first electrical connection part 240 and the contact structure 220 is further reduced.

In other embodiments, as shown in FIG. 3, the top surface of the diffusion barrier layer 222 between the conductive body 221 and the first electrical connection part 240 may also be flush with the top surface of the conductive body 221.

In some embodiments, the material of the diffusion barrier layer 222 is the same as the material of the first barrier layer 241, and the material of the conductive body 221 is the same as the material of the first conductive layer 242. For example, the materials of the diffusion barrier layer 222 and the first barrier layer 241 are both titanium nitride. The materials of the conductive body 221 and the first conductive layer 242 are both tungsten.

In other embodiments, the material of the diffusion barrier layer 222 may also be different from the material of the first barrier layer 241, and the material of the conductive body 221 may also be different from the material of the first conductive layer 242. For example, the material of the diffusion barrier layer 222 is titanium nitride, and the material of the first barrier layer 241 is tantalum nitride. The material of the conductive body 221 is copper, and the material of the first conductive layer 242 is tungsten.

In the semiconductor structure provided by the above embodiments, the first electrical connection part 240 includes a first barrier layer 241 and a first conductive layer 242 which are stacked. In the direction from the source to the drain, the distance between the sidewall of the first barrier layer 241 facing the contact structure 220 and the contact structure 220 is a first distance $L_1$, and the distance between the sidewall of the first conductive layer 242 facing the contact structure 220 and the contact structure 220 is a second distance $L_2$, in which the first distance $L_1$ is greater than the second distance $L_2$. That is, the bottom contour of the first electrical connection part 240 is changed, such that the distance between the first barrier layer 241 and the contact structure 220 adjacent thereto is relatively large. Accordingly, in the process of forming the first electrical connection part 240 and the second electrical connection part 250, the problem that the distance between the first electrical connection part 240 and the contact structure 220 is close due to an alignment deviation is avoided, thereby reducing the risk of short circuit, and also increasing the process window for forming the first electrical connection part 240 and the second electrical connection part 250.

Another embodiment of the present disclosure provides a method for preparing a semiconductor structure that can form the semiconductor structure provided in the previous disclosed embodiments. The method for preparing the semiconductor structure provided in another embodiment of the present disclosure will be described in detail below with reference to the accompanying drawings.

FIGS. 4-8 are schematic structural diagrams corresponding to each step of the method for preparing a semiconductor structure provided by another embodiment of the present disclosure.

Figure 4:
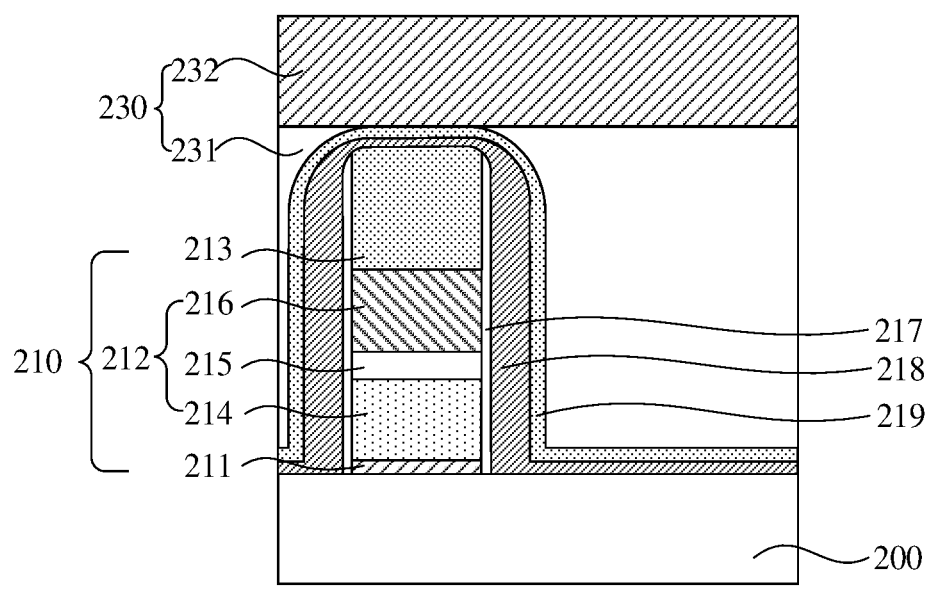
FIGS. 4-8 are schematic structural diagrams corresponding to each step of a method for preparing the semiconductor structure provided by an embodiment of the present disclosure.

Referring to FIG. 4, a substrate 200 and a gate 210 located on the substrate 200 are provided. A source or a drain is provided in the substrate 200 at either side of the gate. A dielectric layer 230 is further provided on the substrate 200, in which the dielectric layer 230 covers the top surface and the sidewalls of the gate 210;

The substrate 200 is a semiconductor substrate. In some embodiments, the semiconductor substrate is a silicon substrate. In other embodiments, the semiconductor substrate may also be a germanium substrate, a silicon germanium substrate, or a silicon carbide substrate.

The step for forming the gate 210 includes: forming a gate dielectric layer 211, a gate conductive layer 212 and a gate capping layer 213 which are sequentially stacked. In some embodiments, the gate conductive layer 212 may include a first gate conductive layer 214, a barrier layer 215 and a second gate conductive layer 216 which are stacked sequentially.

The method may further includes: forming a first sidewall layers 217 covering the sidewalls of the gate 210; forming a second sidewall layer 218 covering the sidewalls of the first sidewall layers 217, the gate 210, and a part of the substrate 200; and forming an etch stopping layer 219 covering the second sidewall layer 218.

The method further includes: forming a source in the substrate 200 at one side of the gate 210, and forming a drain in the substrate 200 at the other side of the gate 210. In some embodiments, the semiconductor structure is a PMOS transistor, and the doped ions of the source and the drain are P-type ions. In other embodiments, the semiconductor structure is an NMOS transistor, and the doped ions of the source and the drain are N-type ions.

The step for forming the dielectric layer 230 includes: forming a first dielectric layer 231 and a second dielectric layer 232 which are sequentially stacked.

In some embodiments, the density of the second dielectric layer 232 is greater than that of the first dielectric layer 231, so the protective effect of the second dielectric layer 232 on the gate 210 is enhanced. In other embodiments, the density of the second dielectric layer 232 may also be equal to that of the first dielectric layer 231.

A detailed description of the substrate, the gate and the dielectric layer may refer to the specific description of the preceding embodiments and will not be repeated in detail below.

Figure 5:
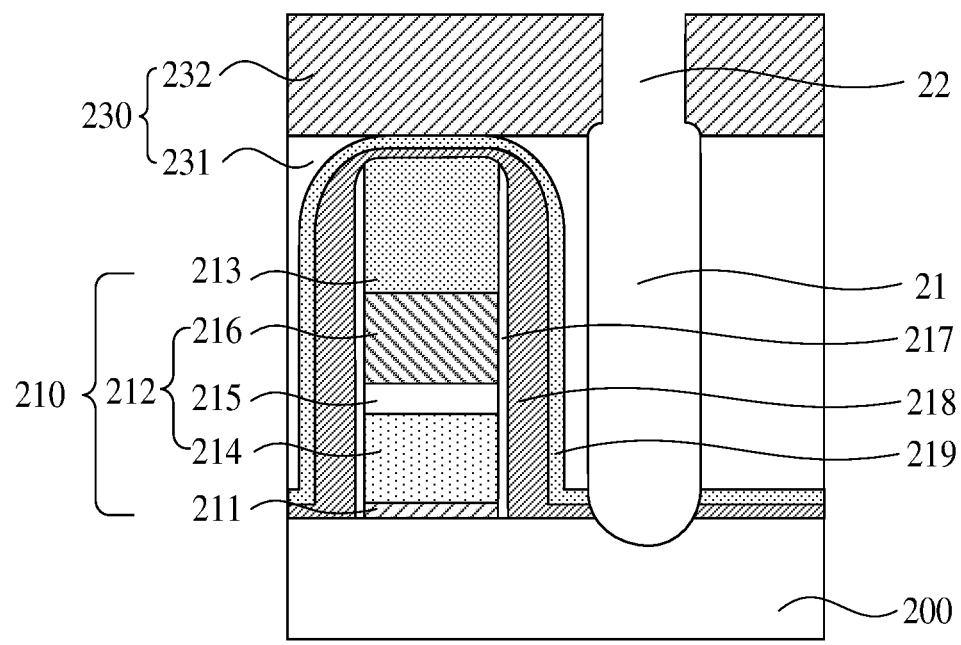
Figure 6:
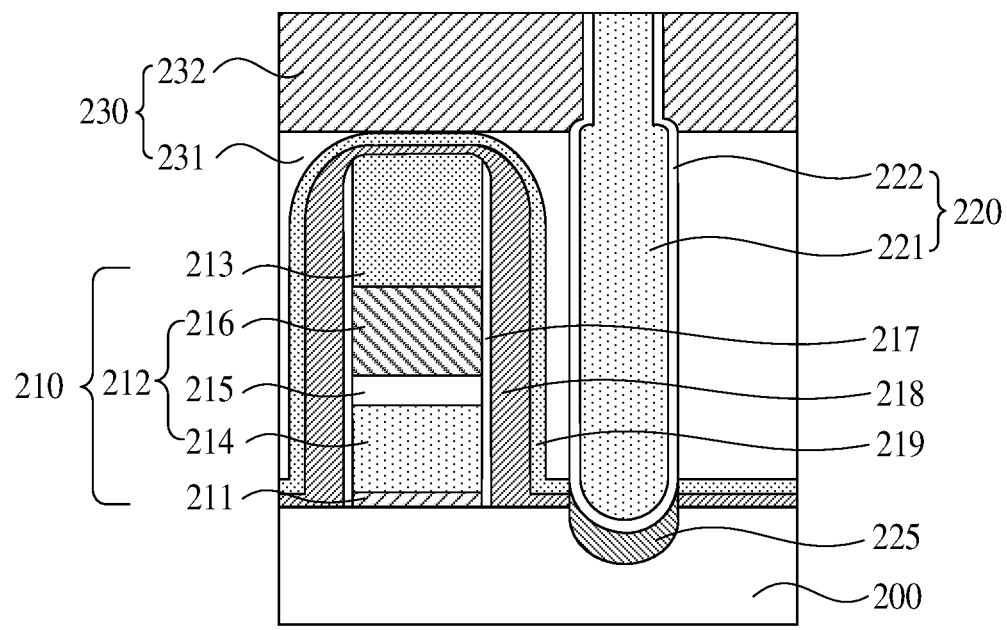

Referring to FIG. 5 and FIG. 6, a contact structure 220 penetrating through the dielectric layer 230 and electrically connected with the source or the drain is formed.

In particular, referring to FIG. 5, the specific step for forming the contact structure 220 includes: patterning the first dielectric layer 231 and the second dielectric layer 232 by etching to form a first through hole 21 and a second through hole 22 which communicate with each other, in which the first through hole 21 penetrates through the first dielectric layer 231, and the second through hole 22 penetrates through the second dielectric layer 232. The first through hole 21 and the second through hole 22 are directly opposite and communicated, so that the first contact layer in the first through hole and the second contact layer in the second through hole are directly opposite and communicated when the contact structure is filled in the first through hole and the second through hole in the following step, so as to allow the contact area between the first contact layer and the second contact layer to be larger, and further reduce the contact resistance between the first contact layer and the second contact layer.

It should be noted that in some embodiments, the first through hole 21 and the second through hole 22 are formed in a same step with the same etching process parameters. In other embodiments, the first dielectric layer 231 and the second dielectric layer 232 may be etched respectively to form the first through hole 21 and the second through hole 22.

The width of the first through hole 21 is larger than the width of the second through hole 22, because the etching rate of the second dielectric layer 232 is lower than the etching rate of the first dielectric layer 231. The density of the second dielectric layer 232 is relatively lager than that of the first dielectric layer 231, so that the etching rate of the first dielectric layer 231 is faster, or the etch selectivity of the etching gas to the material of the second dielectric layer 232 is greater than the etch selectivity to the material of the first dielectric layer 231. Accordingly, a through-hole structure with narrow top and wide bottom is formed in the process of one-step etching. It will be understood that in other embodiments, the width of the first through hole may also be equal to the width of the second through hole.

Referring to FIG. 6, the step for forming the contact structure 220 includes: forming a conductive body 221 and a diffusion barrier layer 222 located on the sidewalls and the bottom of the conductive body in the through hole 20. The diffusion barrier layer 222 may block ions in the conductive body 221 from diffusing into the substrate 200 and the dielectric layer 230.

In some embodiments, the material of the diffusion barrier layer 222 may be TiN or TaN, and the material of the conductive body 221 may be W. In other embodiments, the material of the diffusion barrier layer 222 may also be Ta or Ti, and the material of the conductive body 221 may also be copper or aluminum.

Specifically, the specific step for forming the contact structure 220 is as follows.

An initial diffusion barrier layer is deposited in the first through hole 21 and the second through hole 22 using a deposition process, in which the initial diffusion barrier layer is higher than the top surface of the dielectric layer 230. The part of the initial diffusion barrier layer higher than the top surface of the dielectric layer 230 is removed, remaining part of the initial diffusion barrier layer as the diffusion barrier layer 222;

An initial conductive body is deposited on the surface of the diffusion barrier layer 222 in the first through hole 21 and the second through hole 22 using a deposition process, in which the initial conductive body is higher than the top surface of the dielectric layer 230. The part of the initial conductive body higher than the top surface of the dielectric layer 230 is removed, and the remaining initial conductive body serves as the conductive body 221 to form the contact structure 220.

In some embodiments, the contact structure 220 penetrates through the entire dielectric layer 230. The width of the contact structure 220 located in the first dielectric layer 231 is greater than the width of the contact structure 220 located in the second dielectric layer 232, that is, a structure with narrow top and wide bottom is formed. This is because the density of the second dielectric layer 232 is relatively high, which is difficult to etch in an actual process. Therefore, the width of the contact structure 220 formed in the second dielectric layer 232 is smaller. Compared to the case where the width of the contact structure 220 in the first dielectric layer 231 is equal to the width of the contact structure 220 in the second dielectric layer 232, the width of the contact structure 220 in the first dielectric layer 231 is larger than the width of the contact structure 220 in the second dielectric layer 232 so that the contact structure 220 has an increased overall volume, and therefore has a smaller resistance, thereby improving the current conduction capability. It will be understood that in other embodiments, the width of the contact structure located in the first dielectric layer may also be equal to the width of the contact structure located in the second dielectric layer.

In some embodiments, prior to forming the contact structure 220, a metal silicide layer 225 may also be formed at the bottom of the first through hole 21. The metal silicide layer 225 may reduce the contact resistance between the contact structure 220 and the source or the drain. Specifically, the material of the metal silicide layer 225 may be cobalt silicide.

Referring to FIG. 2, a first electrical connection part 240 and a second electrical connection part 250 that are arranged at intervals are formed, in which the first electrical connection part 240 and the second electrical connection part 250 are both formed on the top surface of the dielectric layer 230, and the second electrical connection part 250 are also in contact with a partial top surface of the contact structure 220. The first electrical connection part 240 includes a first barrier layer 241 and a first conductive layer 242 which are stacked. In the direction from the source to the drain, the distance between the sidewall of the first barrier layer 241 facing the contact structure 220 and the contact structure 220 is a first distance $L_1$, and the distance between the sidewall of the first conductive layer 242 facing the contact structure 220 and the contact structure 220 is a second distance $L_2$, the first distance $L_1$ being greater than the second distance $L_2$.

That is, a hollow is formed among the bottom of the first conductive layer 242, the sidewall of the first barrier layer 241 facing the contact structure 220, and the top surface of the dielectric layer 230. The existence of the hollow allow the distance between the bottom of the first electrical connection part 240 and the contact structure 220 to be increased, thereby reducing the probability of contact between the two, and therefore reducing the possibility of short circuit.

The first barrier layer 241 may block ions in the first conductive layer 242 from diffusing into the dielectric layer 230. Specifically, in some embodiments, the material of the first barrier layer 241 may be TiN or TaN, and the material of the first conductive layer 242 may be W. In other embodiments, the material of the first barrier layer 241 may also be Ta or Ti, and the material of the first conductive layer 242 may also be copper or aluminum.

The process step for forming the first electrical connection part 240 and the second electrical connection part 250 includes the following operations.

Figure 7:
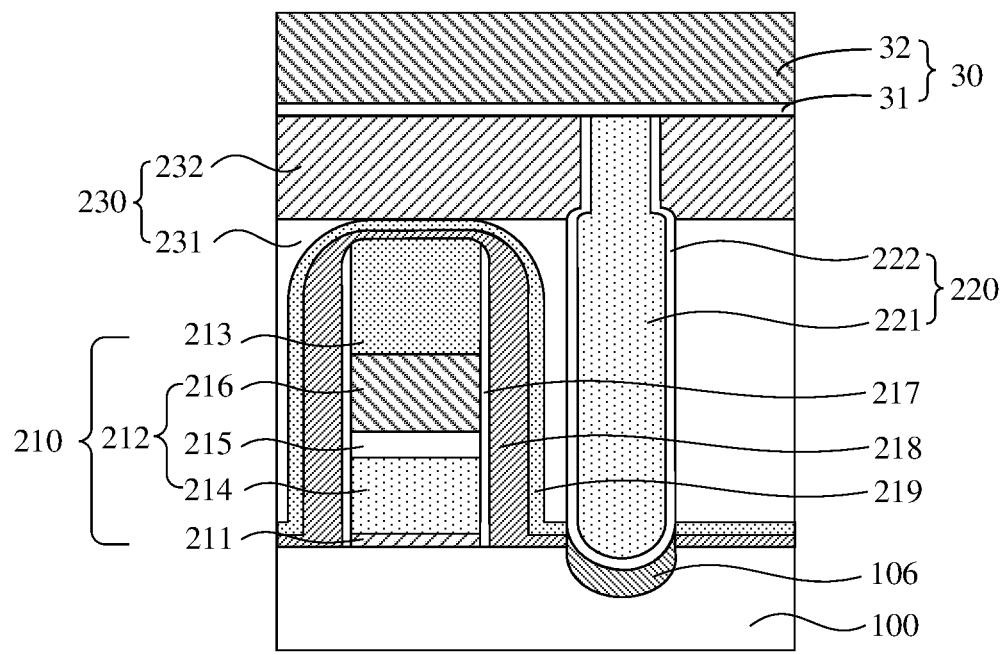

Referring to FIG. 7, an initial barrier layer 31 and an initial conductive layer 32 which are sequentially stacked are formed on the top surface of the dielectric layer 230, in which the initial barrier layer 31 covers the top surface of the contact structure 220. Specifically, the initial barrier layer 31 and the initial conductive layer 32 are sequentially deposited on the top surface of the dielectric layer 230 using a deposition process.

Figure 8:
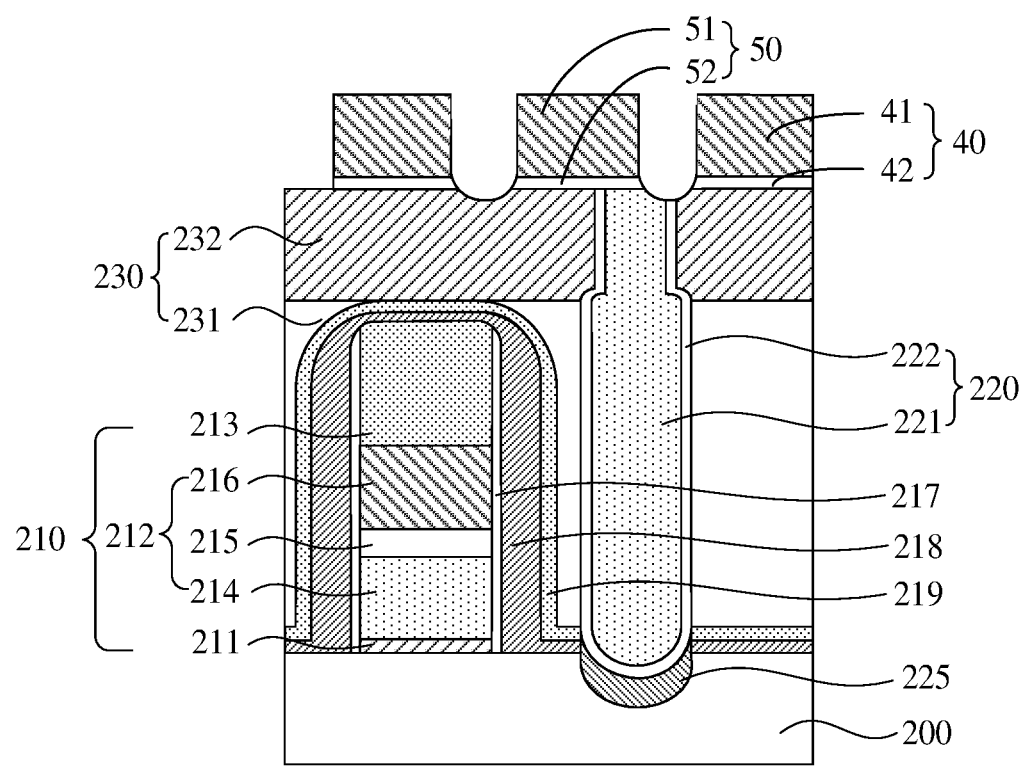

Referring to FIG. 8, the initial conductive layer 32 and the initial barrier layer 31 are patterned to form a first initial electrical connection part 40 and a second initial electrical connection part 50 which are arranged at intervals, in which the second initial electrical connection part 50 is in contact with a partial top surface of the contact structure 220.

The initial conductive layer 32 and the initial barrier layer 31 are etched by dry etching. The method further includes: forming a patterned mask layer on the surface of the initial conductive layer 32 prior to etching the initial conductive layer 32 and the initial barrier layer 31, and etching parts of the initial conductive layer 32 and the initial barrier layer 31 with the patterned mask layer as a mask until a part of the top surface of the contact structure 220 and a part of the top surface of the dielectric layer 230 are exposed. The dielectric layer 230 with the surface portion exposed can isolate the contact structure 220 from the first initial electrical connection part 40 to prevent short circuit due to contacting between them.

In some embodiments, the top surfaces of the contact structure 220 and the dielectric layer 230 with the surfaces exposed may also be further etched to form a concave surface toward the substrate 200. In this way, even in the case that the accuracy of etching parameters is low, the isolation effect can be achieved, increasing the process window for forming the first initial electrical connection part 40 and the second electrical initial electrical connection part.

It will be understood that in other embodiments, the top surfaces of the contact structure and the dielectric layer with the surfaces exposed may not be further etched.

Referring to FIG. 2, the sidewall facing the contact structure 220 of the initial barrier layer 41 (refer to FIG. 8) in the first initial electrical connection part 40 (refer to FIG. 8) is etched. The remaining initial barrier layer 41 (refer to FIG. 8) in the first initial electrical connection part 40 (refer to FIG. 8) forms the first barrier layer 241, and the initial conductive layer 42 (refer to FIG. 8) in the first initial electrical connection part 40 (refer to FIG. 8) forms the first conductive layer 242.

The sidewall of the initial barrier layer 41 may be etched by wet etching.

Only etching the initial barrier layer 41 to change the bottom contour of the first initial electrical connection part 40 allows the distance between the bottom of the first electrical connection part 240 and the sidewall of the contact structure 220 to be relatively large, thereby reducing the risk of short circuit caused by the contact between the first electrical connection part 240 and the sidewall of the contact structure 220. Furthermore, there may be an alignment deviation in the etching process, resulting in that the initial barrier layer 41 is too close to or even comes into contact with the sidewall of the contact structure 220. In this case, the initial barrier layer 41 is etched to increase the distance between the sidewall of the initial barrier layer 41 facing the contact structure 220 and the contact structure 220, thereby avoiding the problem of short circuit caused by electrical connection between the first electrical connection part 240 and the contact structure 220. In this way, the problem that the distance between the first electrical connection part 240 and the contact structure 220 is too close due to an alignment deviation of the etching process can be avoided, and thus the risk of short circuit between the first electrical connection part 240 and the contact structure 220 can be reduced, thereby increasing the process window for forming the first electrical connection part 240 and the second electrical connection part 250. In addition, the width of the initial conductive layer 42 is not changed, that is, the resistance of the initial conductive layer 42 is not changed, so that a good conductivity of the initial conductive layer 42 can be maintained.

In some embodiments, in the process of etching the sidewall facing the contact structure 220 of the initial barrier layer 41 (refer to FIG. 8) in the first initial electrical connection part 40 (refer to FIG. 8), a sidewall of the initial barrier layer 51 (refer to FIG. 8) in the second electrical connection part 50 (refer to FIG. 8) is also etched. That is, a hollow is formed among the bottom of the second conductive layer 252 of the second electrical connection part 250, the sidewall away from the contact structure 220 of the second barrier layer 251 of the second electrical connection part 250 and the top surface of the contact structure 220. The existence of the hollow makes it difficult for the first electrical connection part 240 and the second electrical connection part 250 adjacent thereto to contact, thus further reducing the risk of short circuit. It will be understood that in other embodiments, the sidewall of the initial barrier layer in the second electrical connection part may not be etched.

In some embodiments, in the process of etching the sidewall facing the contact structure 220 of the barrier layer 41 (refer to FIG. 8) in the first initial electrical connection part 40 (refer to FIG. 8), the exposed diffusion barrier layer 222 is also etched. Therefore, the conductive body 221 in the contact structure 220, the dielectric layer 230 and the top surface of the diffusion barrier layer 222 located between the conductive body 221 and the first electrical connection part 240 define a through hole area. The presence of the through hole area further increases the second distance between the first barrier layer 241 and the sidewall of the contact structure 220 compared to the condition without the through hole area. In this way, the risk of short circuit between the first electrical connection part 240 and the contact structure 220 is greatly reduced. It will be understood that in other embodiments, the exposed diffusion barrier layer may also not be etched.

In the method for preparing a semiconductor structure provided by the above disclosed embodiments, the first barrier layer 241 in the first electrical connection part 240 is over-etched so that the distance between the first barrier layer 241 and the sidewall of the contact structure 220 is larger than the distance between the first conductive layer 242 and the sidewall of the contact structure 220. That is, the bottom contour of the first electrical connection part 240 is changed so that the distance between the first barrier layer 241 and the contact structure 220 adjacent thereto is relatively larger, and therefore the two do not easily touch. In the process of forming the first electrical connection part 240 and the second electrical connection part 250, the problem that the distance between the contact structure 120 and the first electrical connection part 240 is close due to an alignment deviation is avoided, thereby reducing the risk of short circuit. Also, a process window for forming the first electrical connection part 240 and the second electrical connection part 250 is increased.

Those of ordinary skill in the art will appreciate that the above-described embodiments are specific embodiments for implementing the present disclosure, and that in practical application, various changes may be made in form and detail thereof without departing from the spirit and scope of the present disclosure. Any person skilled in the art may make their own changes and modifications without departing from the spirit and scope of this disclosure, so the scope of protection of this disclosure shall be subject to the scope defined by the claims.

The invention claimed is:

1. A semiconductor structure, comprising:
   a substrate;
   a gate located on a part of the substrate, wherein a source or a drain is provided in the substrate located at either side of the gate;
   a dielectric layer located on the substrate, wherein the dielectric layer covers a surface of the gate;
   a contact structure penetrating through the dielectric layer and electrically connected with the source or the drain; and
   a first electrical connection part and a second electrical connection part arranged at intervals, wherein the first electrical connection part and the second electrical connection part are both located on a top surface of the dielectric layer, the second electrical connection part is also in contact with a partial top surface of the contact structure, and the first electrical connection part comprises a first barrier layer and a first conductive layer which are stacked, wherein in a direction from the source to the drain, a distance between a sidewall of the first barrier layer facing the contact structure and the contact structure is a first distance, and a distance between a sidewall of the first conductive layer facing the contact structure and the contact structure is a second distance, the first distance being greater than the second distance;
   wherein a material of the first barrier layer comprises TiN or TaN, and a material of the first conductive layer comprises W; and
   wherein the second electrical connection part comprises a second barrier layer and a second conductive layer which are stacked, wherein the second barrier layer is in contact with the partial top surface of the contact structure; and a top surface of the contact structure, a sidewall of the second barrier layer and a bottom surface of the second conductive layer define a hollow area.

2. The semiconductor structure according to claim 1, wherein a width of the first barrier layer is smaller than a width of the first conductive layer in the direction from the source to the drain.

3. The semiconductor structure according to claim 2, wherein a ratio of the width of the first barrier layer to the width of the first conductive layer is 0.5 to 0.9.

4. The semiconductor structure according to claim 1, wherein a thickness of the first barrier layer is smaller than a thickness of the first conductive layer.

5. The semiconductor structure according to claim 1, wherein a width of the first barrier layer is equal to a width of the second barrier layer in the direction from the source to the drain.

6. The semiconductor structure according to claim 1, wherein, a material of the first barrier layer is the same as a material of the second barrier layer; and a material of the first conductive layer is the same as a material of the second conductive layer.

7. The semiconductor structure according to claim 1, wherein an orthographic projection of the first barrier layer on a surface of the substrate is within an orthographic projection of the first conductive layer on the surface of the substrate, and an orthographic projection area of the first barrier layer on the surface of the substrate is smaller than an orthographic projection area of the first conductive layer on the surface of the substrate.

8. The semiconductor structure according to claim 1, wherein the contact structure comprises:
   a conductive body penetrating through the dielectric layer, wherein the second electrical connection part is in contact with a partial surface of the conductive body;
   a diffusion barrier layer located on sidewalls and a bottom of the conductive body.

9. The semiconductor structure according to claim 8, wherein a top surface of the diffusion barrier layer located between the conductive body and the first electrical connection part is lower than a top surface of the conductive body, and the conductive body, the dielectric layer and the top surface of the diffusion barrier layer located between the conductive body and the first electrical connection part define a through hole area.

10. The semiconductor structure according to claim 8, wherein a material of the diffusion barrier layer is the same as a material of the first barrier layer.

11. A method for preparing a semiconductor structure, comprising:
   providing a substrate and a gate located on a part of the substrate, wherein a source or a drain is provided in the substrate located at either side of the gate; a dielectric layer is also provided on the substrate, wherein the dielectric layer covers a surface of the gate;
   forming a contact structure penetrating through the dielectric layer and electrically connected with the source or the drain;
   forming a first electrical connection part and a second electrical connection part arranged at intervals, wherein the first electrical connection part and the second electrical connection part are both located on a top surface of the dielectric layer, the second electrical connection part is also in contact with a partial top surface of the contact structure, and the first electrical connection part comprises a first barrier layer and a first conductive layer which are stacked, wherein in a direction from the source to the drain, a distance between a sidewall of the first barrier layer facing the contact structure and the contact structure is a first distance, and a distance between a sidewall of the first conductive layer facing the contact structure and the contact structure is a second distance, the first distance being greater than the second distance;
   wherein a process step of forming the first electrical connection part and the second electrical connection part comprises:
   forming, on the top surface of the dielectric layer, an initial barrier layer and an initial conductive layer which are sequentially stacked, wherein the initial barrier layer covers a top surface of the contact structure;
   patterning the initial conductive layer and the initial barrier layer to form a first initial electrical connection part and a second initial electrical connection part which are arranged at intervals, wherein the second initial electrical connection part is in contact with the partial top surface of the contact structure;
   etching a sidewall facing the contact structure of the initial barrier layer in the first initial electrical connection part, wherein remaining initial barrier layer in the first initial electrical connection part serves as the first barrier layer, and remaining initial conductive layer in the first initial electrical connection part serves as the first conductive layer.

12. The method for preparing a semiconductor structure according to claim 11, wherein in a process step of etching the sidewall facing the contact structure of the initial barrier layer in the first initial electrical connection part, a sidewall of the initial barrier layer in the second electrical connection part is also etched.

13. The method for preparing a semiconductor structure according to claim 11, wherein the contact structure comprises a conductive body and a diffusion barrier layer located on sidewalls and a bottom of the conductive body; wherein in the process step of etching the sidewall facing the contact structure of the initial barrier layer in the first initial electrical connection part, the diffusion barrier layer exposed is also etched.

* * * * *